(12) United States Patent
Peng et al.

(10) Patent No.: US 11,665,820 B2
(45) Date of Patent: May 30, 2023

(54) ADAPTER BOARD AND METHOD FOR MAKING ADAPTER BOARD

(71) Applicants: QING DING PRECISION ELECTRONICS (HUAIAN) CO.,LTD, Huai an (CN); Avary Holding (Shenzhen) Co., Limited., Shenzhen (CN)

(72) Inventors: Man-Zhi Peng, Huaian (CN); Rui-Wu Liu, Huaian (CN); Ming-Jaan Ho, New Taipei (TW)

(73) Assignees: QING DING PRECISION ELECTRONICS (HUAIAN) CO., LTD, Huai an (CN); Avary Holding (Shenzhen) Co., Limited., Shenzhen (CN)

( * ) Notice: Subject to any disclaimer, the term of this patent is extended or adjusted under 35 U.S.C. 154(b) by 73 days.

(21) Appl. No.: 17/536,321

(22) Filed: Nov. 29, 2021

(65) Prior Publication Data
US 2022/0087020 A1 Mar. 17, 2022

Related U.S. Application Data

(62) Division of application No. 16/767,878, filed as application No. PCT/CN2019/083964 on Apr. 23, 2019, now abandoned.

(51) Int. Cl.
*H05K 1/16* (2006.01)
*H05K 3/14* (2006.01)
(Continued)

(52) U.S. Cl.
CPC ........... *H05K 1/112* (2013.01); *H05K 3/0014* (2013.01); *H05K 3/0052* (2013.01); *H05K 1/119* (2013.01);
(Continued)

(58) Field of Classification Search
CPC .......... H05K 1/16; H05K 1/112; H05K 1/115; H05K 1/119; H05K 1/0287; H05K 3/0014;
(Continued)

(56) References Cited

U.S. PATENT DOCUMENTS 6,332,782 B1  12/2001  Bezama et al.
9,397,035 B2 *  7/2016  Shen ................... H01L 21/4842
(Continued)

FOREIGN PATENT DOCUMENTS

CN  101345199 A  1/2009
CN  105097750 A  11/2015
CN  206628633 U  11/2017

*Primary Examiner* — Xiaoliang Chen
(74) *Attorney, Agent, or Firm* — ScienBiziP, P.C.

(57) ABSTRACT

Disclosure provides an adapter board and a method for making the adapter board, which includes providing a mold in which a plurality of first fixing plates and second fixing plates are provided, providing a plurality of wires sequentially passed through the plurality of first fixing plates and the second fixing plate, injecting a non-conductive material into the cavity to form a body, and cutting the body along both sides of the first fixing plates and the second fixing plates to obtain a plurality of board bodies. The first fixing plates are provided with a plurality of first fixing holes, and the second fixing plates are provided with a plurality of second fixing holes. The board body includes a first surface and a second surface. A plurality of first connection pads are formed on the first surface, and a plurality of second connection pads are formed on the second surface.

7 Claims, 5 Drawing Sheets

(51) Int. Cl.
*H01L 23/13* (2006.01)
*H01L 23/60* (2006.01)
*H01L 23/488* (2006.01)
*H05K 1/11* (2006.01)
*H05K 3/00* (2006.01)

(52) U.S. Cl.
CPC ......... *H05K 3/0029* (2013.01); *H05K 3/0038* (2013.01); *H05K 2201/09118* (2013.01); *H05K 2201/09445* (2013.01); *H05K 2201/09609* (2013.01); *H05K 2201/09672* (2013.01); *H05K 2203/0169* (2013.01)

(58) Field of Classification Search
CPC .. H05K 3/0029; H05K 3/0052; H05K 3/4007; H05K 3/4046; H01L 21/486; H01L 21/4842; H01L 23/13; H01L 23/60; H01L 23/488; H01L 23/3672; H01L 23/3677; H01L 23/4334; H01L 23/4924; H01L 23/49568; H01L 23/49827; H01L 23/49838

USPC ................ 174/251, 535; 361/752, 753, 756; 29/592.1, 605; 257/668, 738, E21.75, 257/E21.511, E21.514, E21.519
See application file for complete search history.

(56) References Cited

U.S. PATENT DOCUMENTS

| | | | |
|---|---|---|---|
| 9,685,399 B2* | 6/2017 | Kimura | H01L 23/4334 |
| 10,910,300 B1* | 2/2021 | Peng | H01L 24/32 |
| 2003/0042912 A1 | 3/2003 | Breinlinger | |
| 2005/0176273 A1 | 8/2005 | Budell et al. | |
| 2020/0111680 A1 | 4/2020 | Fillion et al. | |
| 2021/0028099 A1* | 1/2021 | Peng | H05K 3/4007 |
| 2021/0235581 A1* | 7/2021 | Peng | H01L 23/60 |

* cited by examiner

ADAPTER BOARD AND METHOD FOR MAKING ADAPTER BOARD

FIELD

The disclosure relates to an adapter board and a manufacturing method thereof, and in particular to an adapter board with different connection pad spans at both ends and a manufacturing method thereof.

BACKGROUND

The adapter board is used to electrically connect upper and lower circuit boards, or connect a circuit board and electronic components. If the center line spans of two pads of the two circuit boards to be connected are not the same, at least two additional conversion layers are required to connect. This method will increase the overall thickness of the adapter board and increase the manufacturing process and cost.

SUMMARY OF THE DISCLOSURE

In view of the above, it is necessary to provide an adapter board and a manufacturing method thereof to solve the above problems.

An adapter board, the adapter board includes a board body and a plurality of wires provided in the board body, and the board body comprises a first surface and a second surface arranged opposite the first surface; the first surface is provided with a plurality of first connection pads, and the second surface is provided with a plurality of second connection pads; each of the first connection pads is connected to one of the second connection pads through a said one of the wires; the first connection pads have a first span, the plurality of second connection pads have a second span, and the first span is not equal to the second span.

A method for making an adapter board, which includes the following steps: providing a mold, in which a plurality of first fixing plates and second fixing plates are provided alternately at intervals, the first fixing plate is provided with a plurality of first fixing holes, and the second fixing plate is provided with a plurality of second fixing holes; providing a plurality of wires, and passing the plurality of wires through the first fixing plate and the second fixing plate in sequence through the first fixing holes and the second fixing holes; injecting a non-conductive material into the mold to form a body; cutting the body along both sides of the first fixing plates and the second fixing plates to obtain a plurality of board bodies, the board bodies comprising oppositely arranged first surfaces and second surfaces; forming a plurality of first connection pads on the first surface and a plurality of second connection pads on the second surface, each of the first connection pads connected to one of the second connection pads through a wire.

The manufacturing method of the adapter board of the present disclosure can produce the adapter board through an injection molding cutting process. The resulting adapter board does not require an intermediate conversion layer, and its volume is relatively small.

BRIEF DESCRIPTION OF THE DRAWINGS

Implementations of the present disclosure will now be described, by way of embodiments, with reference to the attached figures.

SYMBOL DESCRIPTION OF MAIN COMPONENTS

Figure 1:
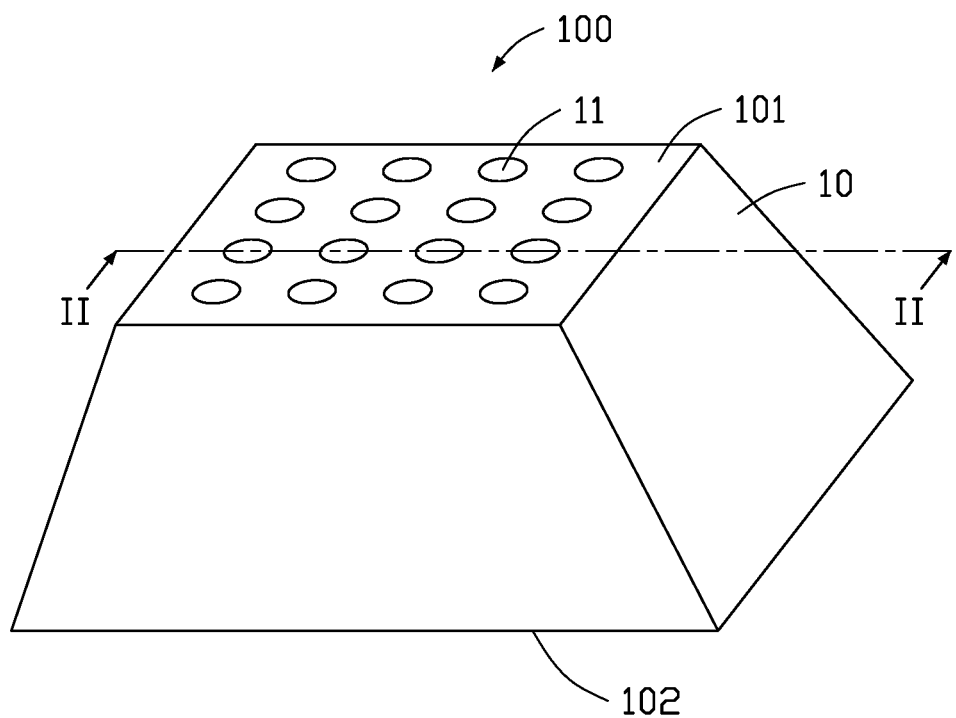
FIG. 1 is a schematic perspective view of an adapter board according to an embodiment of the present disclosure.

Adapter board 100
Plate 10
First surface 101
Second surface 102
First connection pad 11
Second connection pad 12
Lead line 30
First fixing plate 210
First fixing hole 2101
Second fixing plate 220
Second fixing hole 2201
Green Body 300

The following specific embodiments will further illustrate the present disclosure with reference to the above drawings.

DETAILED DESCRIPTION

The technical solutions in the embodiments of the present disclosure will be described clearly and completely in conjunction with the drawings in the embodiments of the present disclosure. Obviously, the described embodiments are only a part of the embodiments of the present disclosure, but not all the embodiments. Based on the embodiments of the present disclosure, all other embodiments obtained by a person of ordinary skill in the art without making creative efforts fall within the protection scope of the present disclosure.

It should be noted that when an element is considered to be "connected" to another element, it may be directly connected to another element or there may be an element that is centrally located at the same time. When an element is considered to be "disposed" on another element, it may be directly arranged on the other element or there may be a centrally arranged element at the same time.

Unless otherwise defined, all technical and scientific terms used herein have the same meaning as commonly understood by those skilled in the technical field of the present disclosure. The terminology used in the description of the present disclosure herein is for the purpose of describing specific embodiments, and is not intended to limit the present disclosure. The term "and/or" as used herein includes any and all combinations of one or more related listed items.

Figure 2:
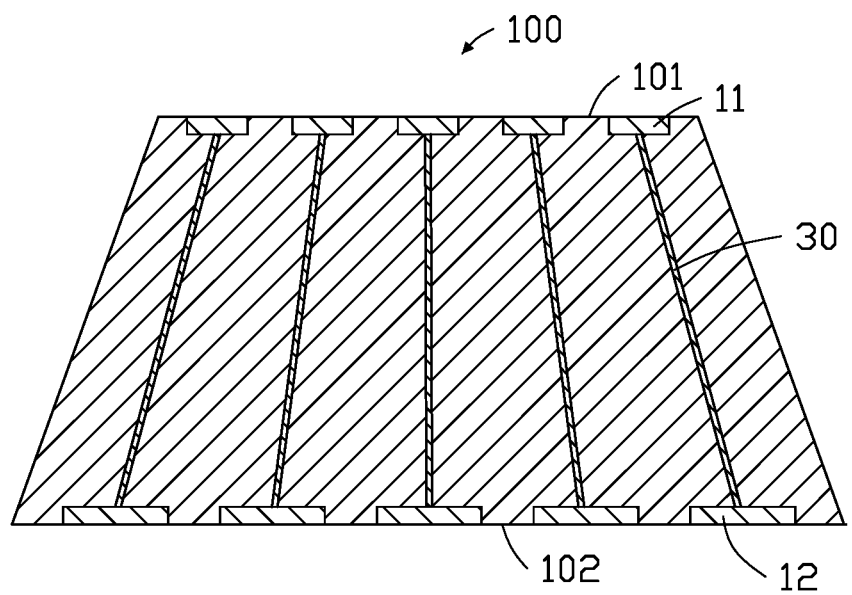
FIG. 2 is a cross-sectional view of the adapter board shown in FIG. 1 along line II-II.

Please refer to FIG. 1 and FIG. 2. The present disclosure provides an adapter board 100, the adapter board 100 is used to electrically connect substrates or components. The substrates may be circuit boards. The components may be electronic components. In this embodiment, the adapter board 100 is used to electrically connect a first component and a second component.

The adapter board 100 includes a board body 10 and a plurality of wires 30 provided in the board body 10.

A material of the board body 10 may be Poly Ether Ether Ketone (PEEK), Poly Tetra Fluoro Ethylene (PTFE), Poly Phenylene Sulfone Resins (PPSU), Liquid Crystal Polymer (LCP), Poly Phenylene Sulfide (PPS), Polytetrafluoro ethylene (PFA), ceramic powder, and other non-conductive materials.

The plate body 10 includes a first surface 101 and a second surface 102. Preferably, the first surface 101 and the second surface 102 are oppositely arranged.

The areas of the first surface 101 and the second surface 102 are not equal. Preferably, the plate body 10 is substantially prism-shaped, and the area of the first surface 101 is smaller than the area of the second surface 102. Preferably, the projection of the first surface 101 on the plane of the second surface 102 falls inside the second surface 102.

The first surface 101 is provided with a plurality of first connection pads 11, and the second surface 102 is provided with a plurality of second connection pads 12. Preferably, the area of the first connection pad 11 is smaller than the area of the second connection pad 12. The distance between the center lines of two adjacent first connection pads 11 is a first span. Preferably, any two adjacent first spans are equal. The plurality of first connection pads 11 are in one-to-one correspondence with the plurality of bonding pads (or component pins) of the first component. That is, the distance between the centerlines of two adjacent pads of the first component is also the first span. The distance between the centerlines of two adjacent second connection pads 12 is a second span. Preferably, any two adjacent second spans are equal. The plurality of second connection pads 12 are in one-to-one correspondence with the plurality of bonding pads (or component pins) of the second component. That is, the distance between the centerlines of two adjacent second component pads is also the second span. The first span is not equal to the second span. Preferably, the first span is smaller than the second span. The plurality of first connection pads 11 are respectively used to connect the plurality of bonding pads of the first component. The plurality of second connection pads 12 are respectively used to connect the plurality of bonding pads of the second component.

The first connection pads 11 may wholly or partially protrude from the first surface 101, or may be embedded in the board body 10. The second connection pads 12 may wholly or partially protrude from the second surface 102, or may be embedded in the board body 10.

The material of the connection pads 11 and the connection pads 12 may be copper, aluminum, silver, gold, copper alloys or aluminum alloys. Preferably, the resistance of the connection pads 11 and the connection pads 12 is less than 0.00001 ohm.

Each wire 30 is respectively connected to a first connection pad 11 and a second connection pad 21. The distance between the center lines of two adjacent wires 30 is a third span. The third span is greater than the first span of the two connected first connection pads 11, and smaller than the second span of the two connected second connection pads 12. As two wires 30 extend from the second connection pads 12 to the first connection pads 11, the third span becomes smaller and smaller.

The material of the wires 30 may be copper, aluminum, silver, gold, copper alloys or aluminum alloys. Preferably, the resistance of the wires 30 is less than 0.00001 ohm.

Preferably, the cross-sectional area of the wires 30 is smaller than the cross-sectional area of the first connection pads 11 and the second connection pads 12 to prevent adjacent wires 30 from contacting and short-circuiting.

Please refer to FIG. 1 to FIG. 5. The present disclosure provides a method for manufacturing an adapter board, which includes the following steps.

Figure 3:
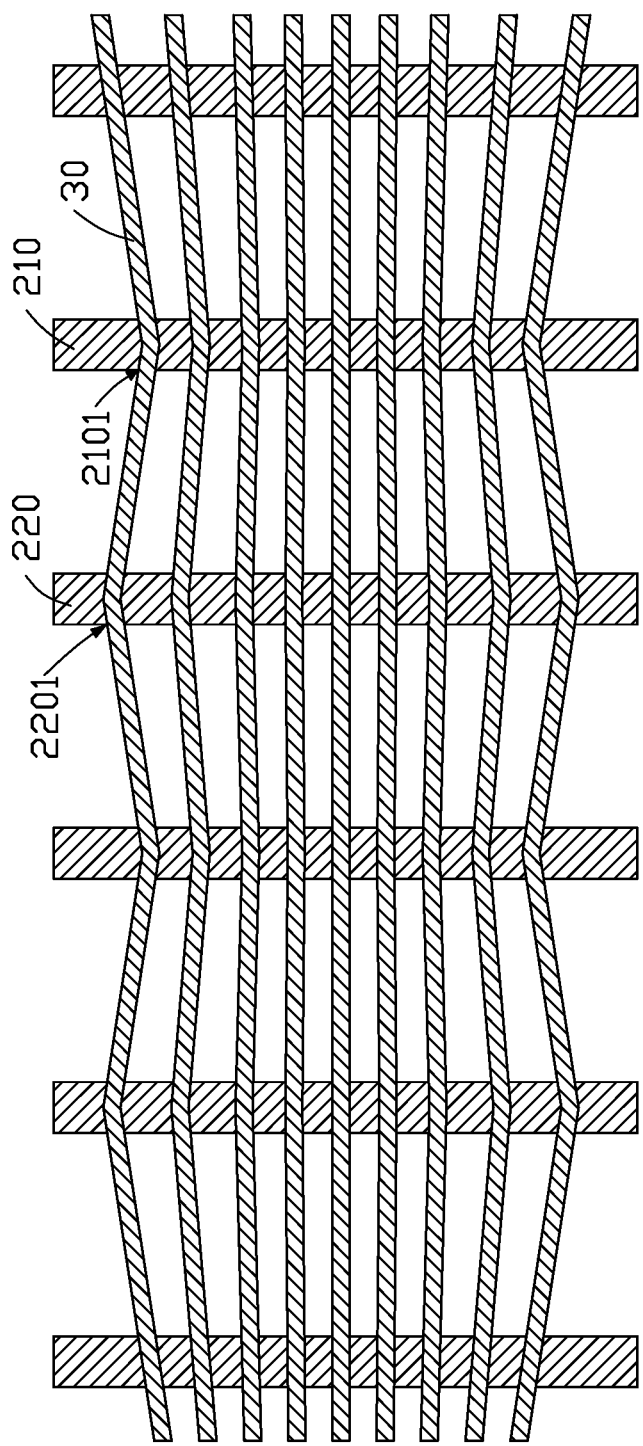
FIG. 3 is a cross-sectional view of wires arranged in a mold according to an embodiment of the present disclosure.

In the first step, please refer to FIG. 3. A mold is provided, and a plurality of first fixing plates 210 and second fixing plates 220 are arranged alternately at intervals in the molding cavity of the mold. The first fixing plate 210 is provided with a plurality of first fixing holes 2101, and the second fixing plate 220 is provided with a plurality of second fixing holes 2201.

The plurality of first fixing holes 2101 correspond to preset positions of the plurality of first connection pads 11. The plurality of second fixing holes 2201 correspond to preset positions of the plurality of second connection pads 12.

In this embodiment, the distance between the centerlines of two adjacent first fixing holes 2101 is smaller than the distance between the centerlines of two adjacent second fixing holes 2201.

In the second step, referring to FIG. 3, a plurality of wires 30 are provided, and the plurality of wires 30 are passed through the first fixing plate 210 and the second fixing plate 220 through the first fixing holes 2101 and the second fixing holes 2201 in sequence. The distance between the center lines of the first fixing holes 2101 is less than the third span of two connected wires, and the distance between the center lines of the second fixing holes 2201 is greater than the third span of two connected wires. As the wires extend from the second fixing holes 2201 to the first fixing holes 2101, the third span becomes smaller and smaller.

The material of the wires 30 may be copper, aluminum, silver, gold, copper alloys, or aluminum alloys. Preferably, the resistance of the wires 30 is less than 0.00001 ohm.

Figure 4:
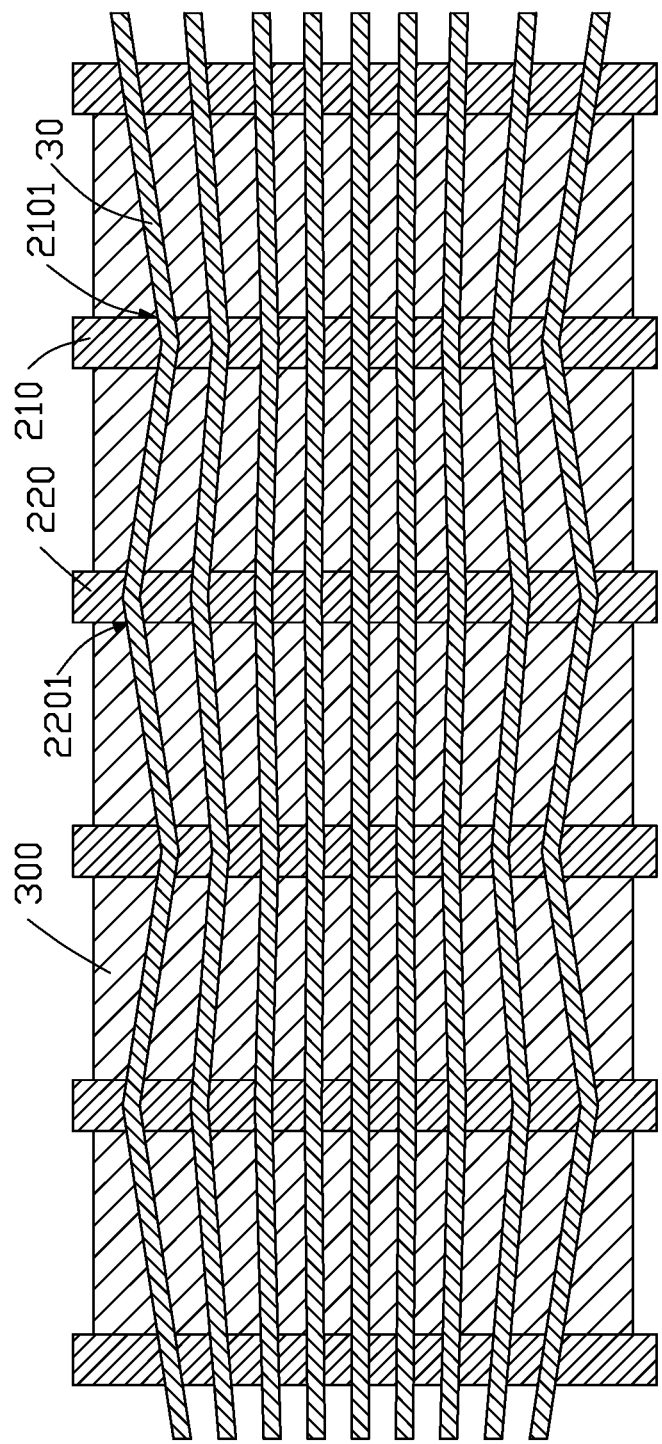
FIG. 4 is a cross-sectional view of FIG. 3 after injecting a mold to form a body.

In the third step, referring to FIG. 4, a non-conductive material is injected into the molding cavity of the mold to form a body 300.

The non-conductive material may be Poly Ether Ether Ketone (PEEK), Poly Tetra Fluoro Ethylene (PTFE), Poly Phenylene Sulfone Resins (PPSU), Liquid Crystal Polymer (LCP), Poly Phenylene Sulfide (PPS), Polytetrafluoro ethylene (PFA), ceramic powder, and other non-conductive materials.

Figure 5:
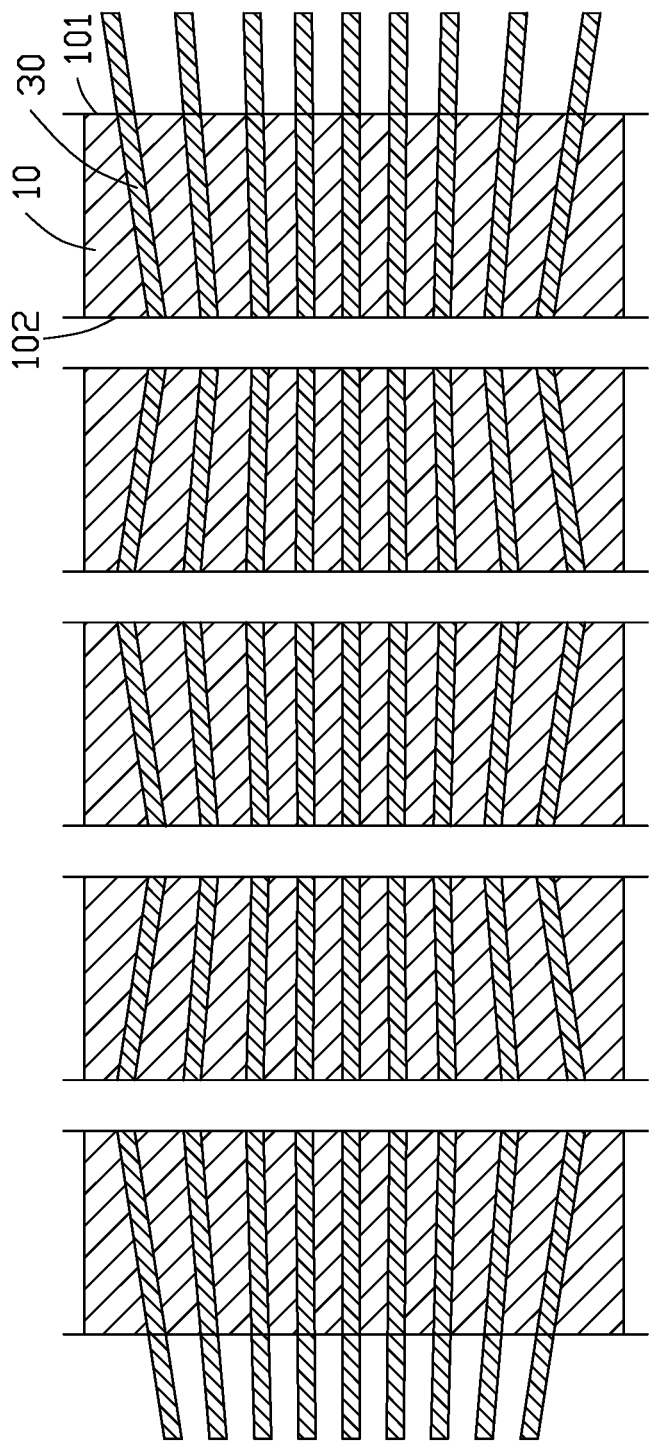
FIG. 5 is a cross-sectional view of the body shown in FIG. 4 cut to form boards.

In the fourth step, referring to FIG. 5, the body 300 is cut along both sides of the first fixing plates 210 and the second fixing plates 220 to obtain a plurality of board bodies 10.

In this step, cutting can be performed by laser or mechanically by a cutter.

The board body 10 includes a first surface 101 and a second surface 102 that are oppositely arranged. A plurality of wires 30 are disposed in the board body 10, and both ends of the wires 30 are respectively exposed from the first surface 101 and the second surface 102.

In the fifth step, referring to FIGS. 1 and 2, a plurality of first connection pads 11 are formed on the first surface 101, and a plurality of second connection pads 12 are formed on the second surface 102.

In this embodiment, the distance between the centerlines of two adjacent first fixing holes 2101 is smaller than the corresponding first span of the first connection pads 11, and the distance between the centerlines of two adjacent second fixing holes 2201 is greater than the corresponding second span of the second connection pads 12.

In this embodiment, a plurality of grooves are formed on the first surface 101 and the second surface 102 by laser ablation of the plate body 10, and then the first connection pads 11 and the second connection pads 12 are formed by plating or filling conductive materials in the grooves.

In other embodiments, the first connection pads 11 and the second connection pads 12 may be formed by etching or electroplating, and other general methods in the industry may also be used.

Each first connection pad 11 is connected to one second connection pad 12 via a wire 30.

In the sixth step, referring to FIG. 1, the board body 10 is cut along the outermost edges of first connection pads 11 and the outermost edges of the second connection pads 12.

The cut portion of the board body 10 does not contain the wires 30.

After cutting, the board body 10 has a substantially truncated pyramid shape, and the occupied space is reduced. It can be understood that in other embodiments, this step may be omitted.

The manufacturing method of the adapter board of the present disclosure can produce the adapter board 100 through an injection molding and cutting process, which has a simple process and low cost. The resulting adapter board 100 does not require an intermediate conversion layer, and its volume is relatively small.

In addition, those skilled in the art can also make other changes within the spirit of the present disclosure. Of course, these changes made in accordance with the spirit of the present disclosure should be included in the scope claimed by the present disclosure.

What is claimed is:

1. A method for making an adapter board, comprising:
    providing a mold, wherein a plurality of first fixing plates and a plurality of second fixing plates are disposed in the mold, the plurality of first fixing plates and the plurality of second fixing plates are provided alternately at intervals, each of the plurality of first fixing plates defines a plurality of first fixing holes, and each of the plurality of the second fixing plates defines a plurality of second fixing holes;
    providing a plurality of wires, and passing the plurality of wires through the plurality of first fixing plates and the plurality of second fixing plates in sequence through the plurality of first fixing holes and the plurality of second fixing holes;
    injecting a non-conductive material into the mold to form a body;
    cutting the body along both sides of each of the plurality of first fixing plates and each of the plurality of second fixing plates to obtain a plurality of board bodies, each of the plurality of board bodies comprising a first surface and a second surface opposite to the first surface;
    forming a plurality of first connection pads on the first surface and a plurality of second connection pads on the second surface, each of the plurality of first connection pads connecting to a corresponding one of the plurality of second connection pads through one of the plurality of wires.

2. The method of claim 1, wherein a distance between centerlines of two adjacent of the plurality of first fixing holes is smaller than a distance between centerlines of two adjacent of the plurality of second fixing holes.

3. The method of claim 1, wherein after forming the plurality of first connection pads and the plurality of second connection pads, the method further comprises:
    cutting each of the plurality of board bodies along outermost edges of the plurality of first connection pads and outermost edges of the plurality of second connection pads.

4. The method of claim 1, wherein a cross-sectional area of the plurality of wires is smaller than a cross-sectional area of the plurality of first connection pads, and is also smaller than a cross-sectional area of the plurality of second connection pads.

5. The method of claim 1, wherein an area of the first surface is smaller than an area of the second surface, and a projection of the first surface on a plane of the second surface falls completely inside the second surface.

6. The method of claim 1, wherein the plurality of board bodies is made of one of Poly Ether Ether Ketone, Poly Tetra Fluoro Ethylene, Poly Phenylene Sulfone Resins, Liquid Crystal Polymer, Poly Phenylene Sulfide, Polytetrafluoro ethylene, and ceramic powder.

7. The method of claim 1, wherein the plurality of wires is made of one of copper, aluminum, silver, gold, copper alloy, and aluminum alloy.

* * * * *